United States Patent
Suthues

(10) Patent No.: US 9,806,672 B2
(45) Date of Patent: Oct. 31, 2017

(54) METHOD AND APPARATUS FOR MEASURING SOLAR CELLS

(71) Applicant: WAVELABS SOLAR METROLOGY SYSTEMS GMBH, Leipzig (DE)

(72) Inventor: Jörn Suthues, Münster (DE)

(73) Assignee: WAVELABS SOLAR METROLOGY SYSTEMS GMBH, Leipzig (DE)

(*) Notice: Subject to any disclaimer, the term of this patent is extended or adjusted under 35 U.S.C. 154(b) by 15 days.

(21) Appl. No.: 14/804,665

(22) Filed: Jul. 21, 2015

(65) Prior Publication Data

US 2015/0333693 A1 Nov. 19, 2015

Related U.S. Application Data

(63) Continuation-in-part of application No. PCT/EP2014/050836, filed on Jan. 16, 2014.

(30) Foreign Application Priority Data

Jan. 21, 2013 (DE) .................. 10 2013 100 593

(51) Int. Cl.
- *G01R 31/26* (2014.01)
- *H02S 50/10* (2014.01)
- *H01L 31/18* (2006.01)

(52) U.S. Cl.
CPC ............ *H02S 50/10* (2014.12); *H01L 31/186* (2013.01); *Y02E 10/50* (2013.01); *Y02P 70/521* (2015.11)

(58) Field of Classification Search
CPC ....... H01L 2924/13091; H01L 2224/81; H01L 2924/0002; H01L 2924/00;

(Continued)

(56) References Cited

U.S. PATENT DOCUMENTS 7,989,729 B1* 8/2011 Zhao .................. G01J 1/08
136/244
8,330,948 B2 12/2012 Gomi
(Continued)

FOREIGN PATENT DOCUMENTS

CN 102183523 A 9/2011
DE 44 40 167 A1 8/1996
(Continued)

OTHER PUBLICATIONS

Martin (Published online Apr. 28, 2009 in Wiley InterScience (www.inteiscience.wiley.com) DOI: 10.1002/pip.901, Reliable Hot-spot Classification in 10 ms using Ultra-fast Lock-in Thermography).*
(Continued)

*Primary Examiner* — Jermele M Hollington
*Assistant Examiner* — Taqi Nasir
(74) *Attorney, Agent, or Firm* — Hudak, Shunk & Farine Co. LPA

(57) ABSTRACT

A method of measuring solar cells, wherein a voltage (U) or a current (I) is applied to a solar cell, and a current (I) and voltage (U), respectively, resulting therefrom is measured, and wherein prior to applying the voltage (U) or current (I) and during or after measuring the resulting current (I) and resulting voltage (U), respectively, a relative distribution of radiation emitted across the solar cell surface area is measured, wherein the voltage (U) or current (I) is applied as at least one pulse with a predeterminable, constant value for a predeterminable period of time, wherein an energy value is calculated from the resulting current (I) and resulting voltage (U), respectively, wherein a first relative distribution of radiation emitted across the solar cell surface area is measured prior to the pulse or each pulse and a second relative distribution of radiation emitted across the solar cell surface (Continued)

area is measured during or after the pulse or each pulse, and wherein a difference distribution is generated from the first and second relative distributions and scaled to the calculated energy value. An apparatus for performing the method. The method and the apparatus serve for the improved sorting of solar cells.

20 Claims, 10 Drawing Sheets

(58) Field of Classification Search
CPC . H01L 2224/45015; H01L 2924/00014; H01L 22/32; H01L 2224/16225; H01L 2224/94; H01L 22/14; H01L 23/481
USPC .......... 324/761.01, 762.01–762.09, 324/763.01–763.02, 541, 512, 528, 531, 324/557
See application file for complete search history.

(56) References Cited

U.S. PATENT DOCUMENTS

| | | | |
|---|---|---|---|
| 2010/0006087 A1* | 1/2010 | Gilon | F24J 2/07 126/572 |
| 2010/0201374 A1 | 8/2010 | Vasilyev et al. | |
| 2011/0153228 A1 | 6/2011 | Ahmad et al. | |
| 2013/0169306 A1* | 7/2013 | Nishikawa | G01J 1/32 324/761.01 |
| 2013/0265077 A1* | 10/2013 | Yang | G01R 31/2607 324/761.01 |
| 2013/0314118 A1* | 11/2013 | Mak | H02S 50/10 324/761.01 |
| 2014/0043056 A1* | 2/2014 | Baba | G01N 21/6489 324/761.01 |
| 2014/0070837 A1* | 3/2014 | Jungerman | G01R 31/2605 324/761.01 |

FOREIGN PATENT DOCUMENTS

| | | |
|---|---|---|
| EP | 1 758 178 A2 | 2/2007 |
| WO | 2012 142651 A1 | 10/2012 |
| WO | WO 2012142651 A1 * | 10/2012 ............. H02S 50/10 |

OTHER PUBLICATIONS

Kasemann, M., et al., Reliable hot-spot classification in 10ms using ultra-fast lock-in thermography, Progress in Photovoltaics: Research and Applications, vol. 17, No. 7, 2009, pp. 441-450, XP055117222.

Ramspeck K., et al., Recombination current and series resistance imaging of solar cells by combined luninescence and lock-in thermography, Applied Physics Letters, American Institute of Physics, US, vol. 90, No. 15, 2007, pp. 1-3, XP012094133.

Kasemann, M., et al., Spatially resolved silicon solar cell characterization using infrared imaging methods, 2008 33rd IEEE Photovolatic Specialists Conference, pp. 1-7, May 1, 2008, XP055117724.

Breitenstein, O., et al., Physical mechanisms of breakdown in multicrystalline silicon solar cells, Photovoltaic Specidalists Conference (PVSC), 2009, 34th IEEE, pp. 181-186, Jun. 7, 2009, XP031626898.

Bachmann, J., et al., Organic solar cells characterized by dark lock-in thermography, Solar Energy Materials and Solar Cells, Elsvevier Science Publishers, Amsterdam, NL, vol. 94, No. 4, Apr. 1, 2010, pp. 642-647, XP026947139.

* cited by examiner

| 0 | 0    | 0    | 0    | 0    | 0    | 0 |
|---|------|------|------|------|------|---|
| 0 | 0    | 0,04 | 0,04 | 0,04 | 0    | 0 |
| 0 | 0,04 | 0,04 | 0,08 | 0,04 | 0,04 | 0 |
| 0 | 0,04 | 0,08 | 0,09 | 0,08 | 0,04 | 0 |
| 0 | 0,04 | 0,04 | 0,08 | 0,04 | 0,04 | 0 |
| 0 | 0    | 0,04 | 0,04 | 0,04 | 0    | 0 |
| 0 | 0    | 0    | 0    | 0    | 0    | 0 |

METHOD AND APPARATUS FOR MEASURING SOLAR CELLS

FIELD OF THE INVENTION

The present invention relates to a method of measuring solar cells, wherein a voltage or a current is applied to a solar cell, and a current and voltage, respectively, resulting therefrom, are measured, and wherein prior to the application of the voltage or the current and during or after measuring the resulting current and resulting voltage, respectively, a relative distribution of radiation emitted across the solar cell surface area is measured. It also relates to a corresponding apparatus, comprising a voltage source or a current source, a current measuring apparatus and a voltage measuring apparatus, respectively, and a radiation measuring apparatus for measuring a relative distribution of radiation emitted across the solar cell surface area.

BACKGROUND OF THE INVENTION

Such methods and apparatus are generally known. They serve for the detection of hot spots. Hot spots are areas on the solar cell in which an excessive current is flowing due to a local short circuit, which translates into heat so that the result may be overheating of the solar cell. In the known method, an infrared camera is first used to measure a distribution of radiation emitted on the solar cell surface area. Then the solar cell is illuminated, or a voltage or current is applied to the solar cell, which allows the solar cell to be locally heated. The current or voltage flowing through the solar cell is measured and recorded as a function of the illumination and/or the applied voltage and current, respectively, i.e. a so-called characteristic of the solar cell is measured. Subsequently, a distribution, resulting from the characteristic, of radiation emitted on the solar cell surface area is measured, and a difference distribution is produced from the two measured distributions. Certain properties of the solar cell can be calculated from the difference distribution, such as a maximum radiation intensity or a surface area of the maximum radiation intensity.

The drawback of the well-known methods is that the energy introduced into the solar cell due to measuring the characteristic varies from one solar cell to another since different solar cells heat up to differing degrees under different applied voltages or currents. When sorted, solar cells having a radiation intensity above a limit value are rejected. However the amount of energy introduced into a shaded solar cell is not taken into consideration when a certain voltage is applied to the solar cell.

SUMMARY OF THE INVENTION

It is an object of the present invention to provide a method and an apparatus for measuring solar cells enabling improved sorting of solar cells.

The object is achieved by a method as set forth in the claims. In the method of measuring solar cells, in which a voltage or current is applied to a solar cell and a current and voltage, respectively, resulting therefrom is measured, and wherein a relative distribution of radiation emitted across the solar cell surface area is measured prior to the application of the voltage or the current and during or after measuring the resulting current and resulting voltage, respectively, it is provided that the voltage or the current is applied as at least one pulse with a predeterminable, constant value for a predeterminable period of time, that an energy value is calculated from the resulting current and resulting voltage, respectively, that prior to the pulse or each pulse a first relative distribution and during or after the pulse or each pulse a second relative distribution of radiation emitted across the solar cell surface area is measured, that a difference distribution is generated from the first and second relative distributions and is scaled to the calculated energy value.

An advantage of the invention is that solar cells can be judged according to a predefined amount of introduced energy. They thereby become more comparable than when corresponding parameters are determined as the characteristic is measured. Different solar cells, which have substantially different energy inputs as the characteristic is measured, can thus have the same or at least similar amounts of energy input when measurements are made with a voltage or a current having a predeterminable, constant value. In the opposite case, different solar cells, which have the same or similar energy inputs as the characteristic is measured, can also have substantially different amounts of input energy when measured with a voltage or a current having a constant value. In both cases, solar cells measured with the method according to the present invention would be sorted differently from those measured according to the prior-art methods. Since the energy input into a solar cell is simulated more realistically with the present invention, only solar cells are rejected which would actually reach critical values under real operation conditions. Unnecessary wastage is thus avoided, while unsuitable solar cells are safely identified.

Advantageously, the voltage or the current is applied to the solar cell as precisely one pulse having a predeterminable, constant value for a predeterminable period of time. Measuring the solar cell thus involves particularly low time consumption.

Preferably, a maximum energy of the entire solar cell, a variance, a standard deviation, a surface area or values above the maximum energy, a posture, a position, a halfwidth and/or a gradient of local maxima is determined, and an energy per unit surface area is calculated from the scaled difference distribution. All values can relate to the entire surface area of the solar cell or the solar module, or to defined subareas. On the basis of these data, hot spots can be identified and evaluated.

Advantageously, a resulting maximum operating temperature of the solar cell or of a solar cell module comprising the solar cell, can be determined considering the magnitude of the local maximum, which corresponds to a maximum amount of energy deposited in the solar cell. From the maximum operating temperature, conclusions can be drawn about the properties of the solar cell in the solar cell module, or its suitability for being encased in certain materials.

In preferred embodiments, a time correlation between the measurement of the first and second distribution of radiation emitted across the solar cell surface area on the one hand and the application of the voltage or the current and the measurement of the resulting current and resulting voltage, respectively, on the other hand, is established. Preferably, the second relative distribution is measured within a constant time period after the application of the current or voltage pulse. It can thus be avoided that each solar cell to be measured is measured at a different point in time, so that direct comparison of the measurement results and thus the solar cells among each other leads to more valid results.

Optionally, the first and second relative distribution of the radiation emitted across the solar cell surface area is measured during a predeterminable period of time between 10 ms and 30 ms. This enables the quality of the measurement to be adjusted.

Advantageously, the solar cell is illuminated during the measurement of the first and second relative distributions of the radiation emitted across the solar cell surface area and the application of the pulse or pulses. In this way the solar cell can be measured as under more realistic conditions, i.e. the conditions of use of the solar cell with sunlight are simulated.

In a further advantageous embodiment, the illuminated solar cell is partially shaded during the measurement of the first and second relative distributions of the radiation emitted across the solar cell surface area and the application of the pulse or pulses. This allows the use of the solar cell to be simulated under even more realistic conditions, in which it can be shaded, for example by objects, such as the leaf of a tree, by dirt or the like.

The object is further achieved by an apparatus as set forth in the claims. With an apparatus for measuring solar cells, comprising a voltage source or a current source, a current measuring apparatus and a voltage measuring apparatus, respectively, and a radiation measuring apparatus for measuring a relative distribution of radiation emitted across the solar cell surface area, it is provided that the apparatus comprises a pulse generator for producing and applying at least one pulse of a voltage or a current to a solar cell, wherein the pulse or each pulse has a predeterminable, constant value and a predeterminable period of time, a first evaluating unit for calculating an energy value from the current or voltage, resulting from the pulse or each pulse, measured with the current measuring apparatus and voltage measuring apparatus, respectively, a second evaluating unit for producing a difference distribution from a relative distribution of radiation emitted across the solar cell surface area, each measured prior to and during or after the application of the pulse or pulses, and a third evaluating unit for scaling the difference distribution to the calculated energy value.

Preferably, the radiation measuring apparatus is a microbolometer or a thermographic camera. A microbolometer, in particular, allows the detection of infrared radiation. Microbolometers can be operated at room temperature without cumbersome cooling. Thermographic cameras can detect and map infrared radiation with high precision, also across surfaces. They are expensive, however.

In preferred embodiments, a calculating means is provided for calculating energy per unit area from a posture, a position, a half-width and/or a gradient of local maxima of the scaled difference distribution, and/or for determining a resulting maximum operating temperature of the solar cell, or a solar cell module comprising the solar cell. The one or each calculating means thus delivers useful data about the qualities of the solar cells and thus for sorting them. If more than one calculating means is provided, they can be present as separate devices or as one integrated device.

Advantageously, the apparatus comprises a sorting unit for sorting the solar cell as a function of the posture, position, half-width and/or the gradient of local maxima and/or an energy per unit area and/or the resulting maximum operating temperature of the solar cell or of a solar cell module comprising the solar cell. The or each sorting unit facilitates associating the solar cell with a solar cell array. Solar cells unsuited for solar cell modules can be particularly easily sorted out if they are sorted according to the resulting maximum operating temperature. If more than one sorting unit is used, they can be integrated in one device or separate devices can be used.

Particularly preferably, the apparatus comprises a closed-loop control apparatus for time-correlating the pulse generator and the current measuring apparatus or the voltage measuring apparatus with the radiation measuring apparatus. This makes measurements comparable even for different solar cells.

Advantageously, an illuminating means for illuminating the solar cell during the measurement of the first and second relative distributions of radiation emitted across the solar cell surface area and the application of the pulse or pulses is provided. The illuminating means allows more realistic conditions to be simulated for the later use of the solar cell.

Further advantageously, a shading apparatus for at least partially shading the illumination of the solar cell during measuring of the first and second relative distributions of radiation emitted across the solar cell surface area and the application of the pulse or pulses is provided. The shading apparatus allows shading of the solar cell, such as by leaves, dirt or the like, occurring during real operation, to be simulated, so that even more realistic operating conditions can be created for measuring the solar cells.

BRIEF DESCRIPTION OF THE DRAWINGS

The present invention will be explained in more detail with reference to a preferred exemplary embodiment, wherein:

FIG. 8 shows a section of the difference distribution of FIG. 7 in a matrix view;

DETAILED DESCRIPTION OF THE INVENTION

Figure 1:
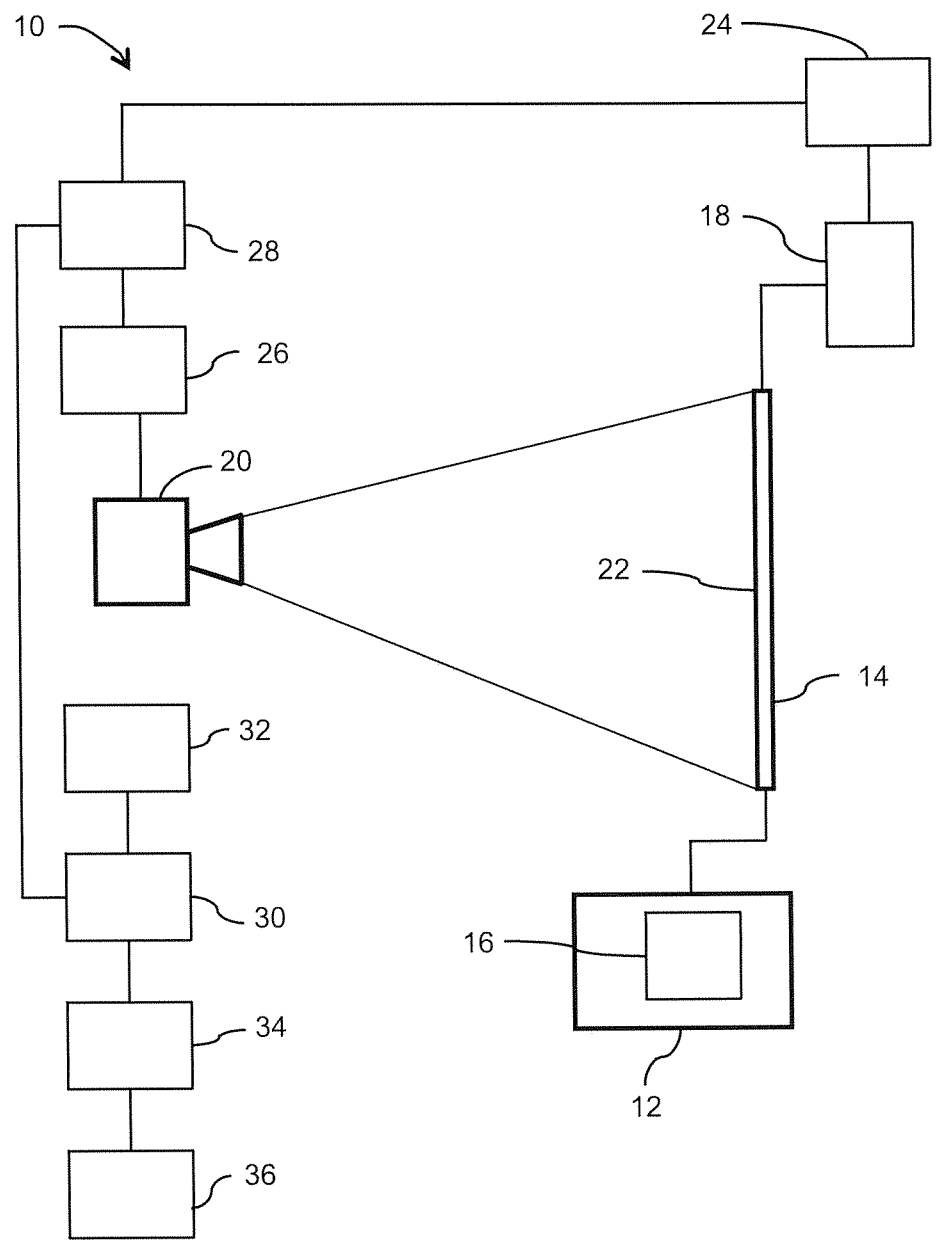
FIG. 1 shows an apparatus according to a first embodiment of the present invention.

With reference to FIG. 1, an apparatus 10 for measuring solar cells is shown according to a first embodiment of the present invention. The apparatus 10 comprises a voltage source 12 allowing a voltage U to be applied to a solar cell 14. The applied voltage U can have a value of, for example, between 0 V and −15 V. The voltage source 12 comprises a pulse generator 16 for generating and applying at least one voltage pulse to the solar cell 14. The at least one voltage pulse can be applied for a predeterminable period of time. Preferably, time periods of 1 ms to 40 ms, preferably 10 ms to 30 ms, particularly preferably 20 ms are used for one voltage pulse. Alternatively, the apparatus can also comprise a current source with a pulse generator for generating and applying at least one current pulse to the solar cell to be measured, the optionally predeterminable period of time being on the same scale as for a voltage pulse. Furthermore, the apparatus 10 comprises a current measuring apparatus 18 for measuring a current I, which flows through the solar cell 14 as a voltage is applied. If, alternatively, a current pulse is applied to the solar cell 14, a voltage measuring apparatus is provided instead of the current measuring apparatus 18, which detects the voltage U generated within the solar cell 14 due to the application of the current I.

The apparatus 10 also comprises a radiation measuring apparatus 20 for measuring a relative distribution of the radiation emitted across the solar cell surface area 22. The distribution is measured with the aid of a microbolometer or a thermographic camera. A first relative distribution of the radiation emitted across the solar cell surface area 22 is recorded prior to—in this example—a voltage pulse and a second relative distribution is recorded during or after a or the voltage pulse. A time period during which the first and second distributions of emitted radiation are measured can be, for example, about 10 ms to 30 ms, preferably 20 ms.

In the example shown here, the apparatus 10 also comprises a first evaluating unit 24 for calculating an energy value from the current I measured by the current measuring apparatus 18 and the value and length in time of the applied voltage pulse. A second evaluating unit 26 is provided to generate a difference distribution of a relative distribution of the radiation emitted across the solar cell surface area measured prior to and during or after application of the pulse. A third evaluating unit 28 is used to scale the difference distribution to the energy value calculated in the first evaluating unit 24. The scaled difference distribution represents the energy stored in the solar cell irrespective of the energy dissipated by the solar cell to the environment or the solar module, i.e., for example, glass or plastic. It also varies according to the contact interfaces of the solar cell as a function of whether the solar cell is surrounded or cooled by an airflow.

A first calculating means 30 is provided for calculating a maximum energy of the entire solar cell, a variance, a standard deviation, a surface area or values above the maximum energy, a posture, a position, a half-width and/or a gradient of local maxima from the scaled difference distribution. Energy per unit surface area of the solar cell 14 can be calculated from the calculated values of the local maxima. The energy per unit surface area can be indicated in Joule per $cm^2$ or in Joule per pixel. A first sorting unit 32 is connected to the first calculating means 30 in the example shown here, which sorts the solar cell 14 as a function of the calculated energy or energies. Herein, limit values are considered for each energy value.

In the present example, a second calculating means 34 is also connected to the first calculating means 30, allowing a resulting maximum operating temperature of the solar cell 14, or the solar cell module comprising the solar cell 14, to be determined, taking into consideration the magnitude of the local maxima. As an alternative, the second calculating means 34, like the first calculating means 30, can be connected directly to the third evaluating device 28, and can derive therefrom the data for calculating the maximum operating temperature independently from the calculation of the first calculating means 30. In a further alternative embodiment, only one calculating means may be provided, for calculating either energies or an operating temperature or both. In further alternative embodiments, three, four, five, or more calculating means may also be provided to calculate further parameters, e.g. an energy deposited in the solar cell, normalized to an area, and/or an area of maximum stored energy.

Energy flows into the environment of the solar cell 14 are already considered by scaling the difference distribution. Using the data from the second calculating means 34, a second sorting unit 36 sorts the solar cell 14 as a function of the resulting maximum operating temperature. A limit value resulting in the solar cell 14 being rejected is, e.g., below the melting point of a plastic or glass surrounding the solar cell 14 within the solar cell module. For example, the cross-linking temperature of ethylene vinyl acetate (EVA), a plastic material often used in solar cell modules, is about 120° C. At and above this temperature, the plastic melts and gases out in certain circumstances. This can affect the operation of the solar cell module, so that a limit value for the maximum operating temperature, above which the solar cell 14 should be rejected, is at 120° C. for EVA. In alternative embodiments, depending on the sorting desired, only one of the two sorting units 32, 36 may be provided. In further alternative embodiments, three, four, five or more sorting units may be provided to sort the solar cells on the basis of further parameters, such as the energy stored in the solar cell, normalized to an area, and/or the area of maximum energy. In some embodiments, the sorting units can be connected to the calculating means which determines the parameter according to which the solar cell is to be sorted. In alternative embodiments, the calculating means can be arranged in one device while the sorting units are arranged in another device. Alternatively, each calculating means can be combined with a sorting unit in one and the same device. In the present embodiment, preferably, the same parameter is to be determined, or to be used for sorting.

In an alternative embodiment, all calculating means, evaluating units and/or sorting units can be integrated in one device.

Figure 2:
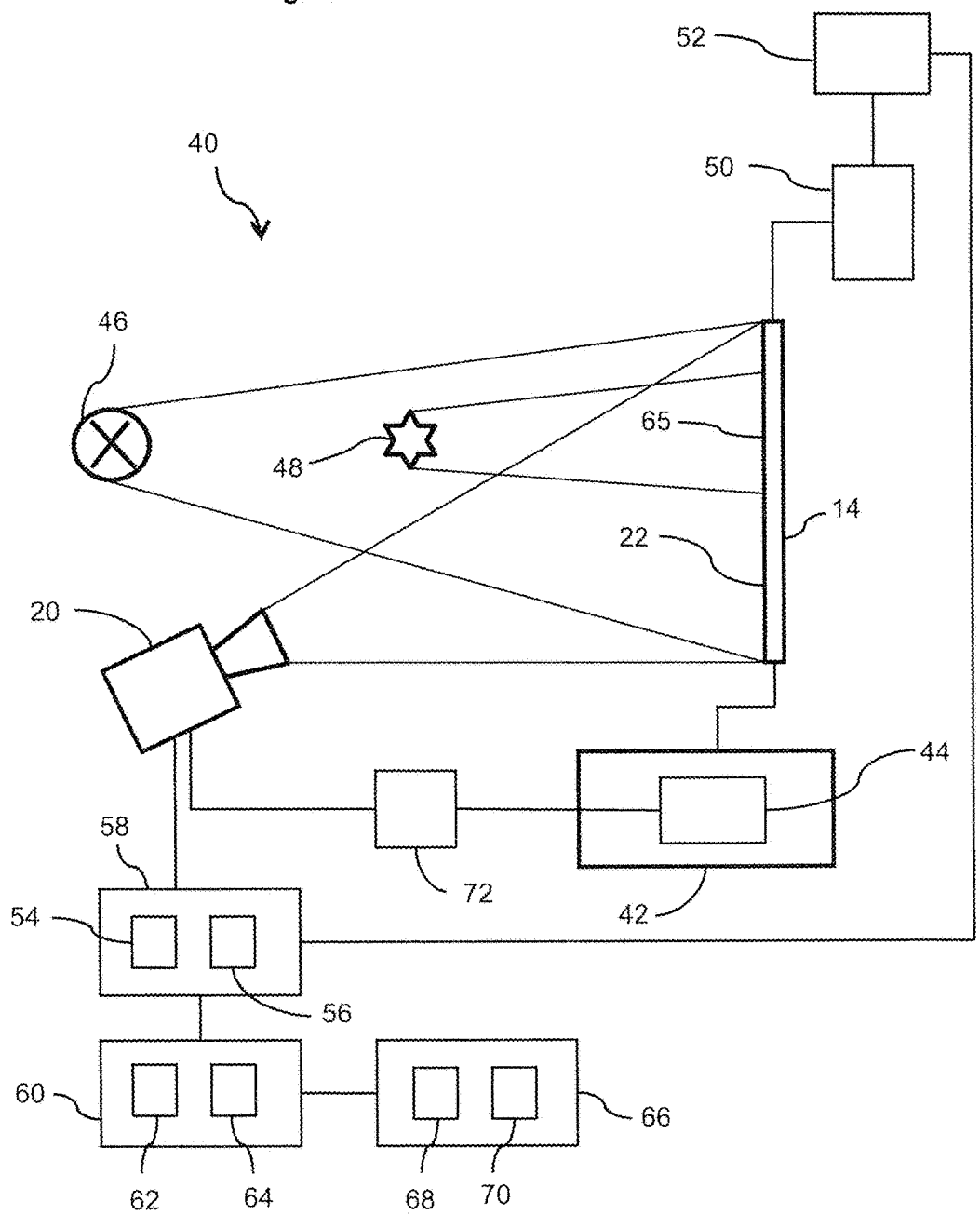
FIG. 2 shows an apparatus according to a second embodiment of the present invention.

FIG. 2 shows an apparatus 40 according to a second embodiment of the present invention. In this apparatus 40, a current source 42 and a pulse generator 44 are used to generate and apply a current pulse at 8 A, for example, which corresponds to an operating current of 35 $mA/cm^2$ in solar cells of the usual size, to the solar cell 14. A plurality of current pulses can also be applied to the solar cell 14. Additionally, the solar cell 14 is illuminated by an illuminating means 46, wherein only part of the solar cell 14 is illuminated due to a shading apparatus 48, simply shown as a shading object in the present case. Apart from simple shading objects, such as templates, suitable shading apparatuses are, for example, controllable shading apparatuses, such as described in DE 10 2011 052 047 A1. In alternative embodiments, no shading apparatus is provided, but only an illuminating means which illuminates the solar cell 14. A voltage U resulting in the solar cell 14 from the current pulse and the shaded illumination is detected by a voltage measuring apparatus 50.

The apparatus 40 also comprises a first evaluating unit 52 for calculating an energy value from the voltage U measured by the voltage measuring apparatus 50 and value and length in time of the applied current I.

A second evaluating unit 54 for generating a difference distribution from a relative distribution of radiation emitted across the solar cell surface area measured by a radiation measuring apparatus 20 prior to and during or after the application of the current pulses and the shaded illumination, and a third evaluating unit 56 for scaling the difference distribution to the energy value calculated in the first evaluating unit 52 are arranged in an evaluating device 58. The data for generating the difference distribution in the second evaluating unit 54 derive from the radiation measuring apparatus 20. The third evaluating unit 56 derives its data from the first evaluating unit 52. As an alternative, the second and third evaluating units 54, 56 can also be arranged separately instead of being integrated in an evaluating device 58. In a further alternative embodiment, the first evaluating unit 52 can be arranged in the evaluating device 58 in addition to the second and third evaluating units 54, 56.

A calculating device 60 comprises a first calculating means 62 for calculating an energy per unit area from a maximum energy of the entire solar cell, a variance, a standard deviation, an area of values above the maximum energy, a posture, a position, a half-width and/or a gradient of local maxima of the scaled difference distribution. A second calculating means 64 is also arranged in the calculating device 60, enabling a resulting maximum operating temperature of the solar cell to be determined while taking the calculated parameters into consideration. The energy deposited in the solar cell 14 results from the sum of the energies input by the current pulse and the illumination. The energy resulting from the illumination is the sum of the irradiation magnitude, the solar cell surface area 22 and an area 65 shaded by the shading apparatus 48. Alternatively, instead of arranging the calculating means 62, 64 in a calculating device 60, it is also possible to arrange the calculating means 62, 64 individually. In an alternative embodiment, the first or second calculating means 62, 64 can be dispensed with, depending on the calculation desired. In further alternative embodiments, more than two calculating means can also be provided in order to determine further parameters of the solar cell.

A first and a second sorting unit 68, 70 are arranged in a sorting device 66, wherein the first sorting unit 68 can sort the solar cell 14 as a function of the overall energy stored within it, the energy normalized to an area and/or the area of maximum energy, and the second sorting unit 70 can sort the solar cell 14 as a function of the resulting maximum operating temperature of the solar cell 14 or the solar cell module comprising the solar cell 14. The sorting operations of the first and second sorting units 68, 70 can be in parallel or according to need. Alternatively, the apparatus can only comprise one of the two sorting units 68, 70, as needed. In a further alternative embodiment, the two sorting units 68, 70 can be separately connected to the calculating device 60, i.e. without sorting device 66, or if calculating means 62, 64 are provided separately, they can be connected to these. The first sorting unit 68 derives the data for the sorting operation from the first calculating means 62 and the second sorting unit 70 derives them from the second calculating means 64. In alternative embodiments, more than two sorting units can be provided, e.g. one sorting unit for each parameter determined in the calculating means. In alternative embodiments, the provided calculating means, evaluating units and sorting units can all be integrated in one device.

A closed-loop control apparatus 72 is used to time-correlate the radiation measuring apparatus 20 and the pulse generator 44, so that there is no time offset between the measurements after the pulse or each pulse and measurement deviations can be avoided. Since the radiation emitted by the solar cell 14 is at first at a maximum after the pulse or each pulse, and then decays continuously, the measurement should be within a predetermined time window. For example, the radiation emission can fall to 0 within 100 ms. An advantageous time window would be, for example, between 10 ms and 30 ms. Within this time window, an exact measuring point can be defined by the closed-loop control apparatus 72 for each pulse and each solar cell to be measured, so that the same measuring conditions apply to each measuring result and thus for each solar cell, and the individual solar cells are thus comparable among each other.

Figure 3:
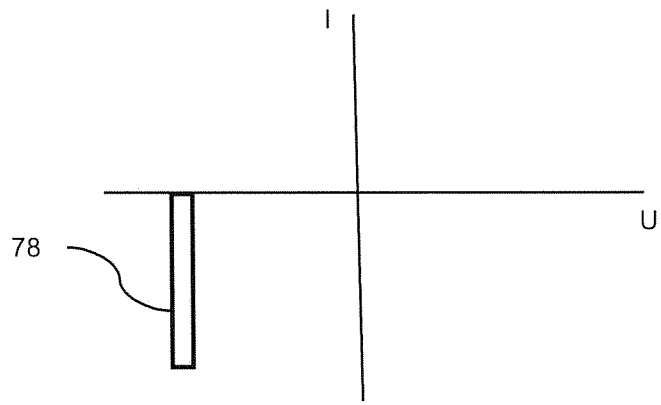
FIG. 3 shows an example of a predefined amount of energy input into the solar cell.

FIG. 3 shows an example of a defined amount of energy introduced into a solar cell. The energy is introduced in the form of a voltage or current pulse 78 applied to the solar cell with a predeterminable, constant value for a predeterminable period of time. For example, a current of about 7.5 A can be measured for a voltage pulse of, e.g., −15 V applied to the solar cell for 9.3 ms. The resulting amount of introduced energy is thus 1.05 Joule.

Figure 4:
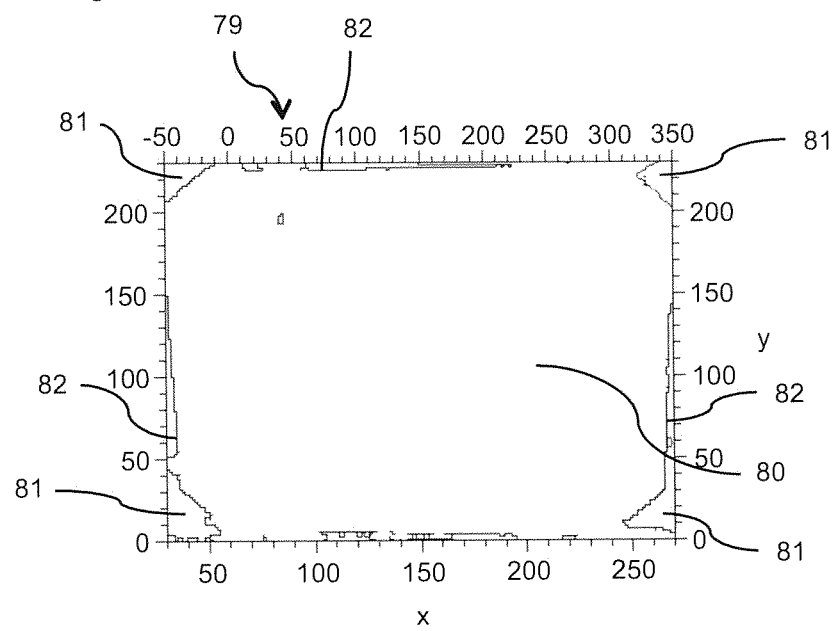
FIG. 4 shows an example of a first relative distribution of radiation emitted across the solar cell surface area.

FIG. 4 shows an example of a first relative distribution 79 of radiation emitted across the solar cell surface area. The distribution 79 was measured with an apparatus according to FIG. 1 before a pulse was applied to the solar cell. The solar cell surface area is represented by about the area 80 shown in the diagram, i.e. the coordinate axes x and y correspond to the dimensions of the solar cell in pixels having, for example, a size of 0.5 mm by 0.6 mm edge length. An edge area 81 is delimited by lines 82 in part from the rest of the diagram area 80, which indicate a demarcation line between an area of higher emitted radiation with respect to an area of lower emitted radiation. In this edge area 81, there are deviations in the emitted radiation in comparison to the rest of the diagram surface 80, due to, for example, the ambient temperature and the chamfered edges of the solar cell.

Figure 5:
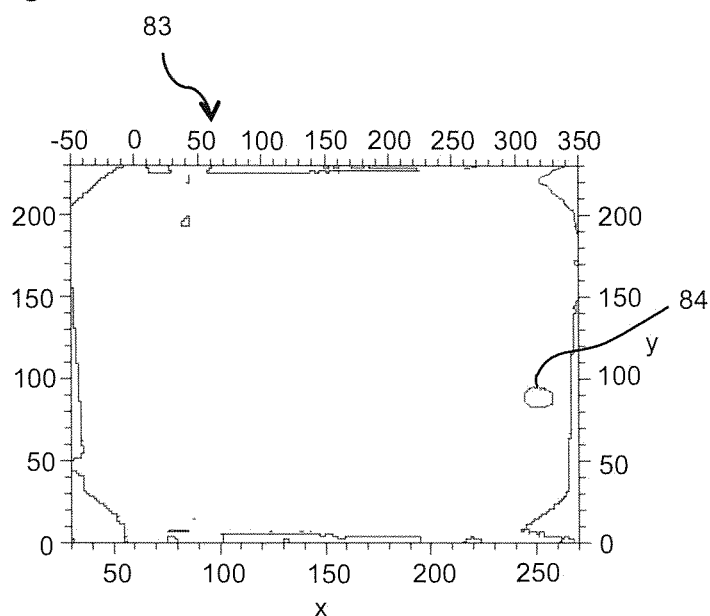
FIG. 5 shows an example of a second relative distribution of radiation emitted across the solar cell surface area.

FIG. 5 shows an example of a second relative distribution 83 of radiation emitted across the solar cell surface area. It was measured with the above-mentioned apparatus immediately after the current pulse. The emitted radiation can be alternatively measured up to a maximum of 100 ms after the current pulse, after that the radiation emission has decayed to a point where measuring no longer makes sense. The second distribution 83 differs from the first distribution 79 essentially by an area 84 in which higher radiation is emitted by the solar cell.

Figure 6:
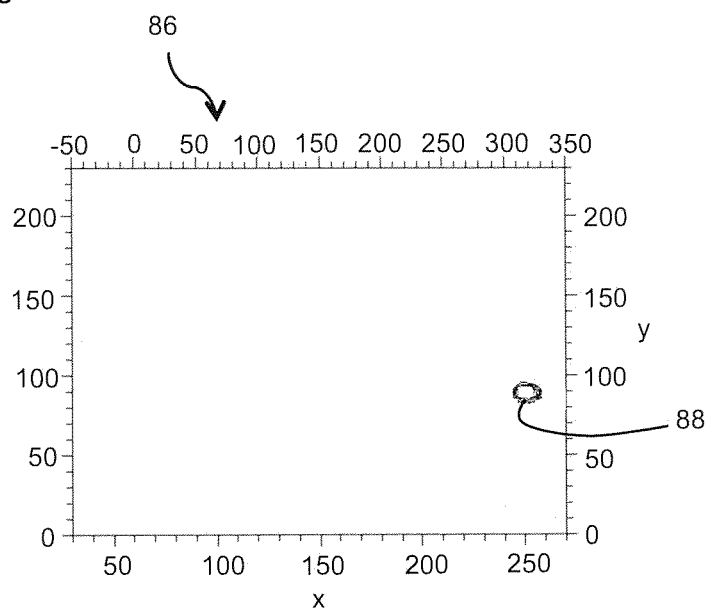
FIG. 6 shows a difference distribution from the first and second relative distributions.

FIG. 6 shows a difference distribution 86 generated by the second evaluating unit 54 from the first and second relative distributions 79, 83. There is a higher radiation emission in an area 88. The value of the energy which can be read in this area 88 is scaled with the energy value calculated in the first evaluating unit and can then be directly used for evaluating the solar cell without having to consider external influences on the solar cell.

Figure 7:
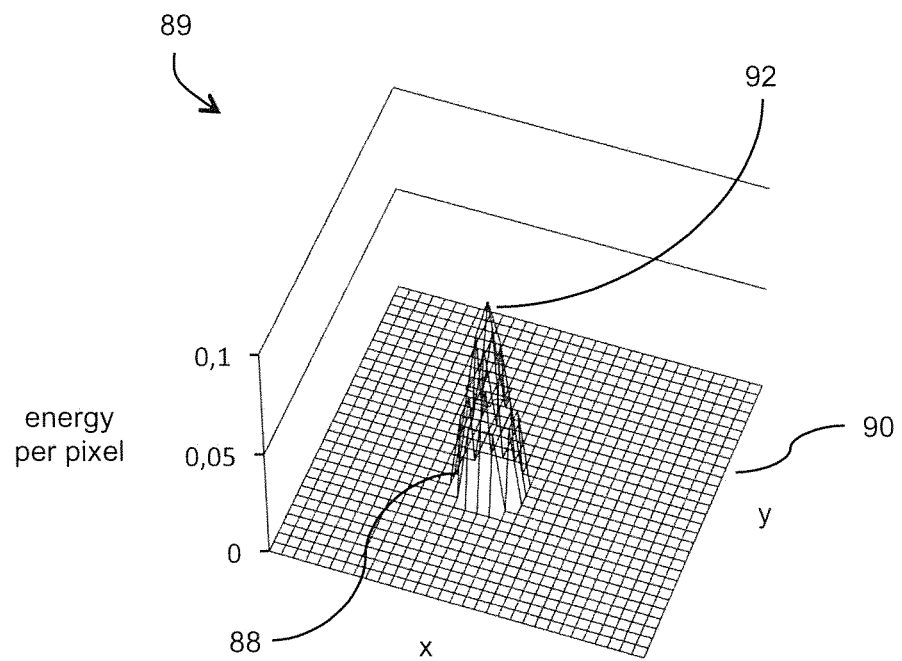
FIG. 7 shows the difference distribution of FIG. 6 in a three-dimensional view.

FIG. 7 shows a scaled difference distribution 89, corresponding to the difference distribution 86 of FIG. 6, after it has been scaled to the calculated energy value, in a three-dimensional diagram. Only part of the solar cell surface area, comprising the area 88 with increased radiation emission, is represented by the base area 90 of the diagram. The higher energy introduction in comparison with the rest of the areas on the illustrated portion of the solar cell surface area is shown by a peak 92, which corresponds to a local maximum of the scaled difference distribution 89. The z axis is the energy per unit area in Joule per pixel. Due to the voltage pulse of −15 V which was applied to the solar cell for 9.3 ms, an overall amount of energy of 1.05 J was stored in the solar cell. The maximum of the peak 92, which can be read on the z axis, is at 0.093 J per pixel in the present example. The variance of the energy distribution is at about $5.5 \times 10^{-5}$ $J^2$ per square pixel, the standard deviation is at about 0.007 J per pixel, a surface area whose energy per surface area is greater than 50% of the maximum, i.e. greater than 0.0465 J per pixel, is at 5 pixels. The gradient of the maximum is at 0.032 J per square pixel.

FIG. 8 shows a portion of the scaled difference distribution 89 of FIG. 7 in the area of the peak 92 in a matrix view. The energy values per pixel are rounded to the second decimal place. In the present illustration, the peak is composed of three different energy values, 0.04 J per pixel, 0.08 J per pixel and 0.09 J per pixel.

Figure 9:
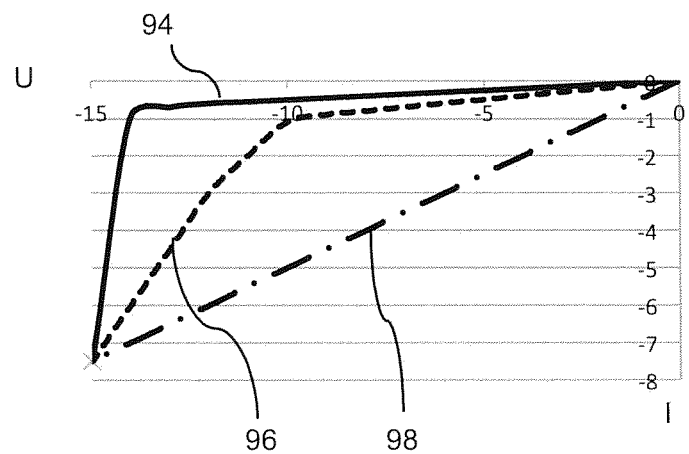
FIG. 9 shows a first example of a characteristic according to the state of the art.

FIG. 9 shows a first example of a characteristic according to the state of the art. In contrast to the voltage and current pulse of FIG. 3 at a constant voltage U and a constant current I, respectively, a voltage range from 0 V to −15 V is traversed in FIG. 9 for three different solar cells, and a so-called reverse characteristic 94, 96, 98 is measured each time. The entire energy of characteristics 94, 96, 98 is converted into heat. Depending on how a solar cell is connected in a solar cell module, there is a maximum voltage, which can act on a shaded solar cell, e.g. 15 V (25*0.6 V) for a series connection of 25 solar cells and 0.6 V for each solar cell. 15 V is thus the maximum voltage of the reverse characteristic. At −15 V, the same current of 7.5 A is measured for each of the three solar cells.

Figure 10:
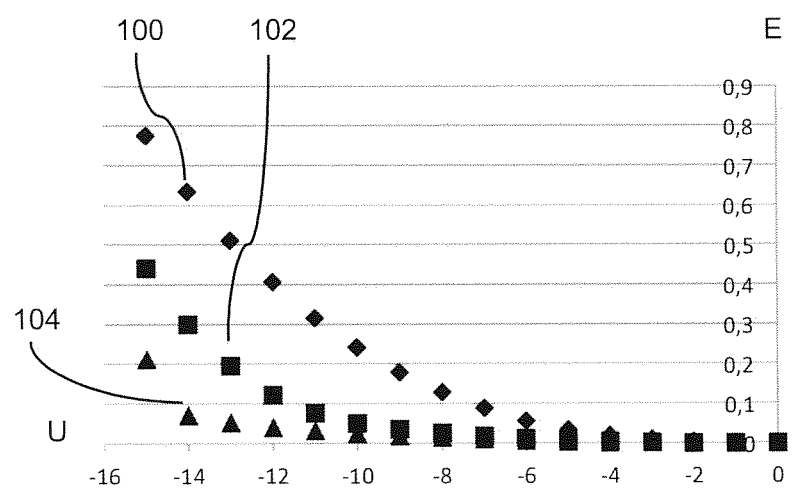
FIG. 10 shows an example of an evaluation of the characteristic of FIG. 8 according the state of the art.

FIG. 10 shows an example of an evaluation of the characteristics 94, 96, 98 of FIG. 9 according to the state of the art. The evaluation is a sum of the energy below the individual characteristic curves 94, 96, 98. Therefore, for the present example, the greatest energy of about 0.78 J results for the characteristic 98 shown as a dash-dotted line in FIG. 9. This is shown as a curve 100 of diamonds in FIG. 10. The second-largest energy of about 0.44 J is deposited in the solar cell for which the dashed line was detected, which is shown as a curve 102 of squares. The lowest energy, i.e. about 0.21 J, is transformed into heat in the solar cell shown as a solid-line characteristic 94. This is shown as a curve 104 of triangles in FIG. 10. In comparison, a current I of 7.5 A is measured in all three solar cells at a voltage pulse of −15 V for a duration of 1.25 ms, and thus an energy of 0.14 J is stored in the solar cell. Sorting on the basis of energy stored in the solar cell according to the present invention thus produces different results from the consideration of the energies according to the characteristics. The present invention allows better sorting of the solar cells since the voltage pulse introduces much less energy into the solar cell than is evident from the measurement of the characteristic. When the characteristic is measured, the energies transformed by the various voltages in the solar cell accumulate so that the energy values are much higher overall than with the method according to the present invention, and thus might exceed a limit value, which could result in the solar cells being unnecessarily rejected.

Figure 11:
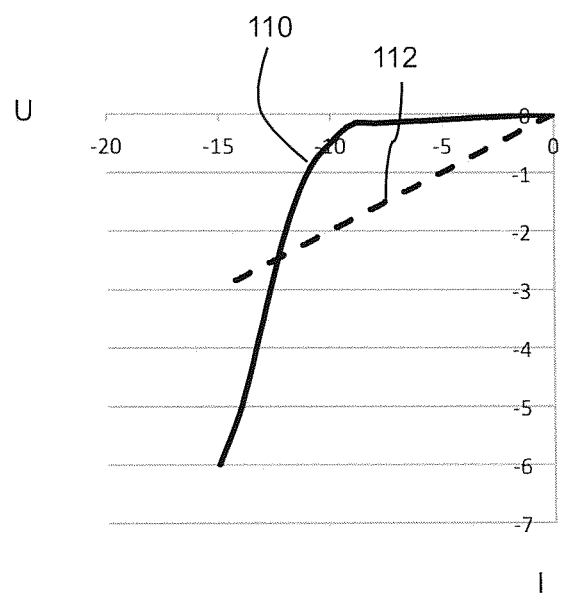
FIG. 11 shows a second example of a characteristic according to the state of the art.

FIG. 11 shows a second example of a measurement of a characteristic according to the state of the art. Here, the characteristics 110, 112 of two further solar cells are measured. Both solar cells transform energy in the amount of 0.31 J into heat during measurement of the characteristic. At a voltage pulse of −15 V over a time period of 1.25 ms, the solar cell having the dashed characteristic 112 transforms energy in the amount of 0.06 J into heat. The solar cell having the solid-line characteristic 110 transforms energy in the amount of about 0.11 J into heat at a voltage pulse of −15 V over a time period of 1.25 ms. If measured according to the state of the art, both solar cells would have been judged or sorted the same, whereas a short voltage pulse at −15 V is sufficient for the one solar cell to store a much higher amount of energy. Such a hot spot can lead to the solar cell being heated up to an extent where the temperature in the vicinity of the solar cell, e.g. in the solar cell module comprising the solar cell, causes high operating temperatures. If these temperatures exceed a limit value, the solar cell has to be rejected, since it may otherwise cause damage to the solar cell module, e.g. because the material surrounding the solar cell module melts.

Figure 12:
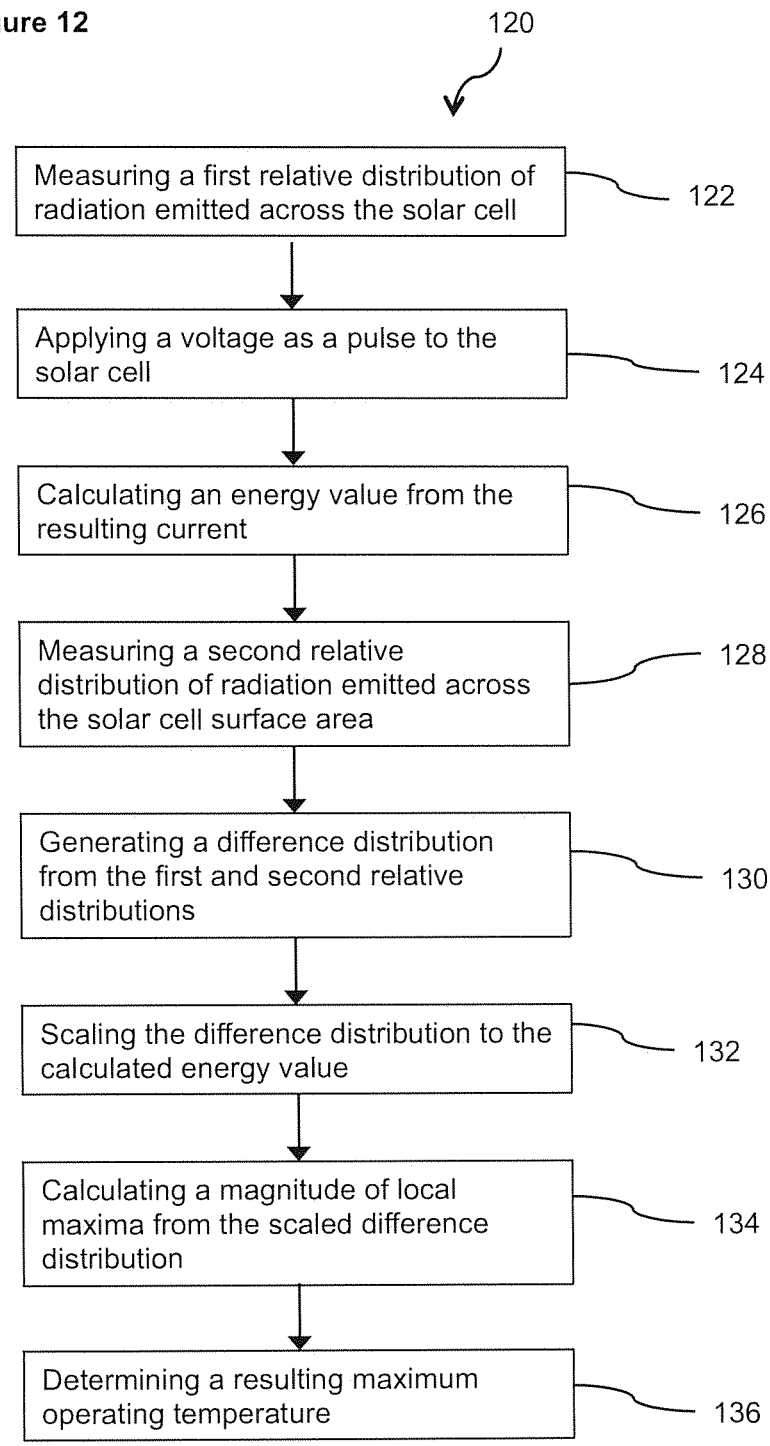
FIG. 12 shows an example of a method of measuring solar cells according to the present invention.

FIG. 12 shows an example of a method 120 for measuring solar cells according to an exemplary embodiment of the present invention. In a first step 122, a first relative distribution of radiation emitted across the surface area of a solar cell to be measured is measured with the aid of a radiation measuring apparatus. In a second step 124, a voltage U is applied to the solar cell as a pulse by means of a voltage source and a pulse generator. In variants of the method, a plurality of voltage pulses, or one or more current pulses can also be applied to the solar cell. In a third step 126, an energy value from the current I resulting in the solar cell from the application of the voltage pulse, measured by a current measuring apparatus, is calculated in a first evaluating unit. If a plurality of voltage or current pulses are applied, the energy values can be averaged. The energy value corresponds to an amount of energy stored in a solar cell. In a fourth step 128, a second relative distribution of radiation emitted across the solar cell surface area is measured. The measurement can occur while the voltage pulse is still applied, or immediately after, e.g. between 10 ms and 30 ms, at the latest 100 ms, after the pulse. In a fifth step 130, a difference distribution is generated in a second evaluating unit from the first and second relative distributions. In a sixth step 132, the difference distribution is scaled to the previously calculated energy value in a third evaluating unit. In this way, interfering influences acting on the solar cell from the measuring environment are reduced. In a seventh step 134, a magnitude of the local maxima is calculated from the scaled difference distribution in a calculating means. This magnitude can be used to judge whether the solar cell is suitable for use in a solar cell module, and can be sorted correspondingly. As a preferred possibility, in an eighth step, the resulting maximum operating temperature of the solar cell as part of a solar module can be determined form the magnitude of the local maxima.

Figure 13:
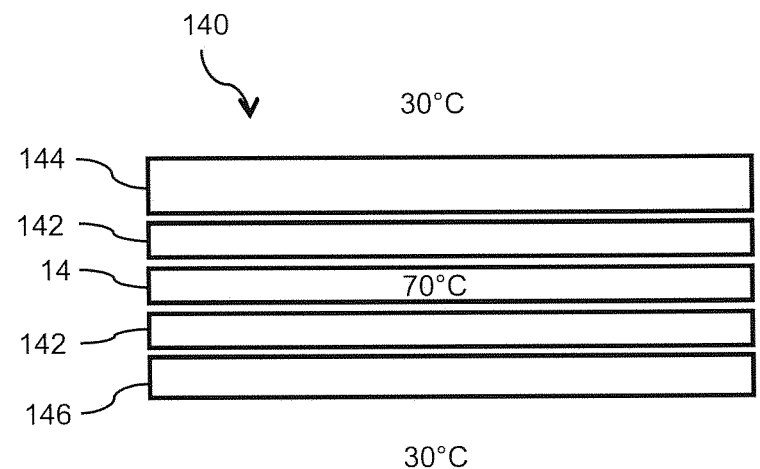
FIG. 13 shows schematically a solar module.

FIG. 13 shows schematically the design of a solar module 140. A layer of one or more solar cells 14 is laminated on both sides with a plastic sheet 142, e.g. made of EVA, and glass sheet 144 on the side to be oriented to the sun and a back sheet 146 on the other side. In the present example, the surrounding temperature is of 30° C., whereas the center temperature in the layer of the solar cell 14 should not be higher than 70° C. to avoid any deterioration of the plastic sheets 142.

Figure 14:
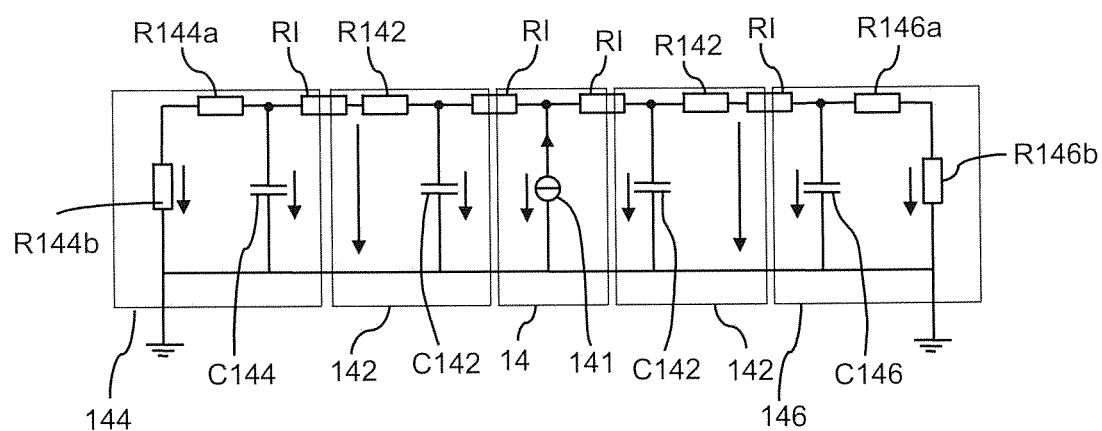
FIG. 14 an equivalent thermal circuit of the solar module of FIG. 13

To evaluate the in consequence highest acceptable energy per surface area unit, e.g. per pixel, on can simulate the behavior of the solar module 140 of FIG. 13 by an equivalent thermal circuit as shown in FIG. 14. The solar cell 14 has a heat source 141 as main component and shows thermal resistance RI at the interfaces to the both neighboring plastic sheets 142. The plastic sheets 142 have characteristic thermal resistance R142 and heat capacitance C142. At the interfaces to the back sheet 146 or the glass sheet there is an additional thermal resistance RI. The value of the thermal resistances RI depends i.a. of the way of fixing, the material used for fixing, the existence of an air gap and its width, etc. The glass sheet 144 has a characteristic thermal resistance R144a and heat capacitance C144 as well as an additional thermal resistance R144b with respect to the surrounding environment. The back sheet 146 has a characteristic thermal resistance R146a and heat capacitance C146 as well as an additional thermal resistance R146b with respect to the surrounding environment, as well.

It is assumed that in case of occurrence of a hot spot in the solar cell 14 induced by application of voltage or current pulse, in a first approximation, the heat flows into the plastic sheets 142, where it is so to speak absorbed by their heat capacitance. Thus, the relevant components are the two thermal resistances RI at the interfaces from solar cell 14 to plastic sheet 142. After the voltage or current pulse, because small heat capacitances C142, C144, C146, they can be disregarded, and the solar cells is in a first approximation equivalent to all resistances R144b, R144a, Ri, R142, RI, RI, R142, RI, R146a, R146b being in series. The heat evacuation in case of a the occurrence of one or more hot spot depends on a general resistance R being the sum of said resistances being in series.

In the present example, voltage pulses of 13 V and a duration $\Delta t_{pulse}$ of 10 ms are applied during testing of the solar cells. If a temperature difference $\Delta T$ of no more than 40 K is to be induced by one or more hot spots in a solar cell, the overall deposited energy $E_{max}$ should not be more than $$E_{max} = \frac{\Delta T}{R} \cdot \Delta t_{pulse}$$

In the present example, R is known by experience to be approximately 0.01 K/W for 1 m². The resulting Emax for 1 m2 is 40,000 mWs. Scaled down on the area of the solar cells of 0.0243 m2, the allowed amount of energy is up to 972 mWs. In the present example, the resolution with which the first and second relative distributions are measured and the difference distribution is generated is of 400×400 pixels. So, the allowed amount of energy per pixel is up to 0.006 mWs.

A first solar cell was measured according to the present method. While applying a voltage pulse of 13 V during 10 ms, a current of 3.5 A was measured. Thus, a total energy of 45.5 mWs was deposited in the solar cell. The difference distribution of a first measurement of the relative distribution of radiation before the pulse and of a second measurement exactly 20 ms after the end of the pulse, which was controlled by closed-loop control apparatus, showed a sum of counts over all pixels of 2,934,003,978. Several local maxima could be detected, the pixel with the highest value having 33,963 counts. Scaled by the deposited total energy, this was equivalent with 0.00527 mWs for this specific pixel, which could lead to an increase of 34.7 K, when part of the solar module of FIG. 13, or a center temperature of 64.7° C. with a surrounding temperature of 30° C. Thus, despite of the occurrence of several hot spots on this solar cell, it could be used in the solar module and does not need to be sorted out.

A second solar cell was measured according to the present method. While applying a voltage pulse of 13 V during 10 ms, a current of 3.5 A was measured. Thus, a total energy of 45.5 mWs was deposited in the solar cell, too. The difference distribution of a first measurement of the relative distribution of radiation before the pulse and of a second measurement exactly 20 ms after the end of the pulse, which was controlled by closed-loop control apparatus, showed a sum of counts over all pixels of 1,179,098,933. A few local maxima could be detected, the pixel with the highest value having 36,021 counts. Scaled by the deposited total energy, this was equivalent with 0.0139 mWs for this specific pixel, which could lead to an increase of 91.5 K, when part of the solar module of FIG. 13, or a center temperature of 121.5° C. with a surrounding temperature of 30° C. Thus, it could not be used in the solar module and should to be sorted out.

LIST OF REFERENCE NUMERALS 10 apparatus
12 voltage source
14 solar cell
16 pulse generator
18 current measuring apparatus
20 radiation measuring apparatus
22 solar cell surface area
24 first evaluating unit
26 second evaluating unit
28 third evaluating unit
30 first calculating means
32 first sorting unit
34 second calculating means
36 second sorting unit
40 apparatus
42 current source
44 pulse generator
46 illuminating means
48 shading apparatus
50 voltage measuring apparatus
52 first evaluating unit
54 second evaluating unit
56 third evaluating unit
58 evaluating device
60 calculating device
62 first calculating means
64 second calculating means
65 surface area
66 sorting device
68 first sorting unit
70 second sorting unit
72 closed-loop control apparatus
78 current/voltage pulse
79 first relative distribution
80 diagram area
81 edge area
82 line
83 second relative distribution
84 area
86 difference distribution
88 area
89 scaled difference distribution
90 base area
92 peak
94 reverse characteristic
96 reverse characteristic
98 reverse characteristic
100 curve
102 curve
104 curve
110 characteristic
112 characteristic
120 method
122 first step
124 second step
126 third step
128 fourth step
130 fifth step
132 sixth step
134 seventh step 136 eighth step
140 solar cell
141 current source
142 plastic sheet
144 glass sheet
146 back sheet
I current
U voltage
RI resistance at interface
R142 resistance of plastic sheet
C142 capacitance of plastic sheet
R144a resistance of glass sheet
R144b resistance of glass sheet
C144 capacitance of glass sheet
R146a resistance of back sheet
R146b resistance of back sheet
C146 capacitance of back sheet

What is claimed is:

1. A method of measuring solar cells, comprising the steps of: applying a voltage or a current to a solar cell, and measuring a current and voltage, respectively, resulting therefrom, and measuring prior to applying the voltage or current and during or after measuring the resulting current and resulting voltage, respectively, a relative distribution of radiation emitted across the solar cell surface area, wherein
the voltage (U) or current (I) is applied as at least one pulse with a predeterminable, constant value for a predeterminable period of time,
an energy value is calculated from the resulting current (I) and resulting voltage (U), respectively,
a first relative distribution of radiation emitted across a solar cell surface area is measured prior to the pulse or each pulse and a second relative distribution of radiation emitted across the solar cell surface area is measured during or after the pulse or each pulse;
a difference distribution is generated from the first and second relative distributions and scaled to the calculated energy value;
a maximum energy of the entire solar cell, a variance, a standard deviation, a surface area or values above the maximum energy, a posture, a position, a half-width and/or a gradient of local maxima is determined from the scaled difference distribution, and an energy per unit surface area is calculated therefrom; and
a resulting maximum operating temperature of the solar cell or a solar cell module comprising the solar cell is determined from the scaled difference distribution.

2. The method according to claim 1, wherein the voltage (U) or the current (I) is applied as exactly one pulse with a predeterminable, constant value to the solar cell for a predeterminable period of time.

3. The method according to claim 1, wherein the measurement of the first and second relative distributions of radiation emitted across the solar cell surface area is time-correlated with the application of the voltage (U) or the current (I) and with the measurement of the resulting current (I) and resulting voltage (U), respectively.

4. The method according to claim 1, wherein the first and second relative distributions of the radiation emitted across the solar cell surface area is measured each time over a predeterminable time period between 10 ms and 30 ms.

5. The method according to claim 1, wherein the solar cell is illuminated during the measurement of the first and second relative distributions of the radiation emitted across the solar cell surface area and the application of the pulse or the pulses.

6. The method according to claim 5, wherein the illuminated solar cell is partially shaded during the measurement of the first and second relative distributions of the radiation emitted across the solar cell surface area and the application of the pulse or the pulses.

7. An apparatus for measuring solar cells, comprising: a voltage source or a current source, a current measuring apparatus and a voltage measuring apparatus, respectively, and a radiation measuring apparatus for measuring a relative distribution of radiation emitted across a solar cell surface area, further comprising
a pulse generator for generating and applying at least one pulse of a voltage (U) or a current (I) to a solar cell, wherein the pulse or each pulse comprises a predeterminable, constant value and a predeterminable time period,
a first evaluating unit for calculating an energy value from the current (I) and voltage (U), respectively, measured with the current measuring apparatus and the voltage measuring apparatus, respectively, resulting from the pulse or each pulse,
a second evaluating unit for generating a difference distribution from a first relative distribution measured prior to the application of the pulse or each pulse and a second relative distribution of radiation emitted across the solar cell surface area, measured during or after the application of the pulse or each pulse,
a third evaluating unit for scaling the difference distribution to the calculated energy value, and
a calculating device for calculating an energy per unit surface area from a posture, a position, a half-width and/or a gradient of local maxima of the scaled difference distribution, and/or for determining a resulting maximum operating temperature of the solar cell or of a solar cell module comprising the solar cell.

8. The apparatus according to claim 7, wherein the radiation measuring apparatus is a microbolometer or a thermographic camera.

9. The apparatus according to claim 7, further comprising a sorting unit for sorting the solar cell as a function of the posture, the position, the half-width and/or the gradient of local maxima and/or an energy per unit surface area and/or the resulting maximum operating temperature of the solar cell or of a solar cell module comprising the solar cell.

10. The apparatus according to claim 7, further comprising a closed-loop control apparatus for time-correlating the pulse generator and the current measuring apparatus and voltage measuring apparatus, respectively, with the radiation measuring apparatus.

11. The apparatus according to claim 7, further comprising an illumination means for illuminating the solar cell during the measurement of the first and second relative distributions of radiation emitted across the solar cell surface area and the application of the pulse or the pulses.

12. The apparatus according to claim 11, further comprising a shading apparatus for providing at least partial shading to the illumination of the solar cell during the measurement of the first and second relative distributions of radiation emitted across the solar cell surface area and the application of the pulse or pulses.

13. The method according to claim 2, wherein the measurement of the first and second relative distributions of radiation emitted across the solar cell surface area is time-correlated with the application of the voltage (U) or the current (I) and with the measurement of the resulting current (I) and resulting voltage (U), respectively.

14. The method according to claim 13, wherein the first and second relative distributions of the radiation emitted across the solar cell surface area is measured each time over a predeterminable time period between 10 ms and 30 ms.

15. The method according to claim 14, wherein the solar cell is illuminated during the measurement of the first and second relative distributions of the radiation emitted across the solar cell surface area and the application of the pulse or the pulses.

16. The method according to claim 15, wherein the illuminated solar cell is partially shaded during the measurement of the first and second relative distributions of the radiation emitted across the solar cell surface area and the application of the pulse or the pulses.

17. The apparatus according to claim 8, further comprising a sorting unit for sorting the solar cell as a function of the posture, the position, the half-width and/or the gradient of local maxima and/or an energy per unit surface area and/or the resulting maximum operating temperature of the solar cell or of a solar cell module comprising the solar cell.

18. The apparatus according to claim 17, further comprising a closed-loop control apparatus for time-correlating the pulse generator and the current measuring apparatus and voltage measuring apparatus, respectively, with the radiation measuring apparatus.

19. The apparatus according to claim 18, further comprising an illumination means for illuminating the solar cell during the measurement of the first and second relative distributions of radiation emitted across the solar cell surface area and the application of the pulse or the pulses.

20. The apparatus according to claim 19, further comprising a shading apparatus for providing at least partial shading to the illumination of the solar cell during the measurement of the first and second relative distributions of radiation emitted across the solar cell surface area and the application of the pulse or pulses.

* * * * *